United States Patent
Li et al.

(10) Patent No.: US 9,735,542 B2
(45) Date of Patent: Aug. 15, 2017

(54) RING-MODULATED LASER

(71) Applicant: Oracle International Corporation, Redwood City, CA (US)

(72) Inventors: Guoliang Li, San Diego, CA (US); Ashok V. Krishnamoorthy, San Diego, CA (US); Xuezhe Zheng, San Diego, CA (US); Ying Luo, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 768 days.

(21) Appl. No.: 14/062,624

(22) Filed: Oct. 24, 2013

(65) Prior Publication Data

US 2016/0204578 A1    Jul. 14, 2016

(51) Int. Cl.
*H01S 5/00* (2006.01)
*H01S 3/10* (2006.01)
*H01S 3/083* (2006.01)
*H01S 5/14* (2006.01)
*H01S 5/10* (2006.01)
*H01S 5/02* (2006.01)
*H01S 5/026* (2006.01)
*H01S 5/028* (2006.01)
*H01S 5/12* (2006.01)

(52) U.S. Cl.
CPC ............ *H01S 5/142* (2013.01); *H01S 5/1032* (2013.01); *H01S 5/021* (2013.01); *H01S 5/0261* (2013.01); *H01S 5/0265* (2013.01); *H01S 5/0287* (2013.01); *H01S 5/12* (2013.01)

(58) Field of Classification Search
CPC ....... H01S 5/1071; H01S 5/021; H01S 5/2214
See application file for complete search history.

(56) References Cited

U.S. PATENT DOCUMENTS

2008/0219614 A1* 9/2008 Gill .......................... G02F 1/225
                                                                385/3
2009/0122817 A1* 5/2009 Sato .................... G02B 6/12007
                                                                372/20

(Continued)

OTHER PUBLICATIONS

Reed et al.; "Silicon Optical Modulators", Nature Photonics 4 (8), 518-526 (2010).

(Continued)

*Primary Examiner* — Yuanda Zhang
(74) *Attorney, Agent, or Firm* — Park, Vaughan, Fleming & Dowler LLP (57) ABSTRACT

An optical source is described. This optical source includes a semiconductor optical amplifier, with a semiconductor other than silicon, which provides a gain medium. In addition, a photonic chip, optically coupled to the semiconductor optical amplifier, includes: an optical waveguide that conveys the optical signal; and a pair of ring-resonator modulators that modulate the optical signal. Furthermore, the pair of ring-resonator modulators is included within an optical cavity in the optical source. For example, the optical cavity may be defined by a reflective coating on one edge of the semiconductor optical amplifier and a reflector on one end of the optical waveguide. Alternatively, the optical cavity may be defined by reflectors on ends of the optical waveguide.

12 Claims, 8 Drawing Sheets

(56) References Cited

U.S. PATENT DOCUMENTS

| | | | | |
|---|---|---|---|---|
| 2009/0324163 A1* | 12/2009 | Dougherty | ............. | B82Y 20/00 385/14 |
| 2010/0322269 A1* | 12/2010 | Liu | ......................... | H01S 5/141 372/20 |
| 2012/0189025 A1* | 7/2012 | Zheng | ................... | H01S 5/1071 372/20 |

OTHER PUBLICATIONS

Li et al.; "25 Gb/s, 1V-driving, CMOS ring modulator with integrated thermal tuning," Optics Express 19 (21), 20435-20443 (2011).

Liu et al. "Passive micro-ring-resonator-coupled lasers", Appl. Phys. Lett 79, 3561-3563 (2001).

Nemoto et al; "Narrow Spectral Linewidth Wavelength Tunable Laser with Si photonic-wire waveguide ring resonators", Group IV phototonics, ThD4, 126-128 (2012).

Segawa et al.; "Semiconductor double-ring-resonator-coupled tunable laser for wavelength routing", IEEE J. Duantum Electron. 45 (7), 892-899 (2009).

Fujioka et al.; "Compact and low power consumption hybrid integrated wavelength tunable laser module using silicon waveguide resonators", Journal of Lightwave Technology 28 (21), 3115-3120 (2010).

\* cited by examiner

RING-MODULATED LASER

GOVERNMENT LICENSE RIGHTS

This invention was made with Government support under Agreement No. HR0011-08-9-0001 awarded by DARPA. The Government has certain rights in the invention.

BACKGROUND

Field

The present disclosure relates to the design of an optical source. More specifically, the present disclosure relates to the design of an optical source that includes ring-resonator modulators within an optical cavity.

Related Art

Silicon photonics is a promising technology that can provide large communication bandwidth, low latency and low power consumption for inter-chip and intra-chip connections or optical links. A key component for a silicon-photonic optical link is an efficient high-speed optical modulator, which is used to convert a high-speed electrical data signal into an optical signal. For example, optical modulators are often used with continuous-wave optical sources, such as lasers. The requirements for an optical modulator are: high speed, low power consumption, low optical loss, a high ON/OFF extinction ratio (ER), and compact size.

Most of the existing high-speed optical modulators in silicon photonics are based on the free-carrier plasma dispersion effect: the index of refraction of silicon decreases as the densities of electrons and holes (i.e., free carriers) increase. In order to use the free-carrier plasma dispersion effect for data modulation, the carrier densities in an optical waveguide are typically electrically modulated. In turn, this modulation modulates the index of refraction and, thus, the optical phase of the propagating laser light. The phase modulation can then be converted into optical intensity modulation (i.e., ON/OFF switching) using a ring-resonator modulator or a Mach-Zehnder interferometer (MZI).

Ring-resonator modulators use strong resonances for modulation, and thus can achieve large ER even with a weak phase modulation. However, ring-resonator modulators typically require precise and dynamic tuning to align the resonance with the laser wavelength. This precise and dynamic tuning can be difficult to implement, and often consumes a large amount of electrical power and results in control circuits that occupy large areas on integrated circuits. While MZI modulators do not need precise and dynamic tuning, they typically need much stronger phase modulation in order to achieve a large ER. Therefore, MZI modulators are usually very long, and need high modulation voltage/power.

Hence, what is needed is a technique for modulating an optical signal without the above-described problems.

SUMMARY

One embodiment of the present disclosure provides an optical source that includes a semiconductor optical amplifier, defined in a semiconductor other than silicon, which has a first edge and a second edge. This semiconductor optical amplifier includes a reflective coating on the first edge, and provides an optical signal at the second edge. Moreover, the optical source includes a photonic chip, optically coupled to the semiconductor optical amplifier, which includes: an optical waveguide that conveys the optical signal; a pair of ring-resonator modulators, optically coupled to the optical waveguide, which modulates the optical signal, where the optical signal is shared between the pair of ring-resonator modulators using the optical waveguide; and a reflector optically coupled to an end of the optical waveguide, where the pair of ring-resonator modulators is included within an optical cavity defined by the reflective coating and the reflector.

In some embodiments, the semiconductor optical amplifier is edge coupled to the photonic chip. Alternatively, the semiconductor optical amplifier may be surface-normal coupled to the photonic chip.

Moreover, the pair of ring-resonator modulators may electrically modulate optical loss in the optical cavity. Note that the pair of ring-resonator modulators may be push-pull modulated so that in a first state resonances of the pair of ring-resonator modulators are aligned and in a second state the resonances are pushed apart.

Furthermore, the optical source further may include a thermal tuning mechanism that adjusts a carrier wavelength of the optical signal.

Additionally, the photonic chip may include: a substrate; a buried-oxide layer disposed on the substrate; and a semiconductor layer disposed on the buried-oxide layer, where the optical waveguide and the pair of ring-resonator modulators are defined in the semiconductor layer. The substrate, the buried-oxide layer and the semiconductor layer constitute a silicon-on-insulator technology.

In some embodiments, the optical signal is output from the optical source at: the first edge of the semiconductor optical amplifier; the reflector; and/or an edge of a directional coupler that is optically coupled to the optical waveguide.

Another embodiment provides a variation on the optical source in which the semiconductor optical amplifier does not have the reflective coating on the first edge. Instead, the semiconductor optical amplifier may provide the optical signal at the first edge and the second edge. Moreover, the optical waveguide may convey the optical signal from the first edge and the second edge, and the pair of ring-resonator modulators, optically coupled to the optical waveguide, may modulate the optical signal. Furthermore, the optical source may include a first reflector and a second reflector optically coupled to ends of the optical waveguide, where the pair of ring-resonator modulators is included within an optical cavity defined by the first reflector and the second reflector.

In this variation on the optical source, the semiconductor optical amplifier may be evanescent coupled or surface-normal coupled to the photonic chip. Furthermore, the optical signal may be output from the optical source at: the first reflector; the second reflector; and/or the edge of the directional coupler that is optically coupled to the optical waveguide.

Another embodiment provides a method for outputting the optical signal. During the method, the semiconductor optical amplifier, defined in the semiconductor other than silicon, generates the optical signal. Then, the optical waveguide on the photonic chip conveys the optical signal. Moreover, the pair of ring-resonator modulators on the photonic chip modulates the optical signal, where the optical signal is shared between the pair of ring-resonator modulators using the optical waveguide. Note that the pair of ring-resonator modulators is included within the optical cavity of the optical source.

In some embodiments, a thermal tuning mechanism thermally tunes the optical source to adjust the carrier wavelength of the optical signal.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an optical source (which is sometimes referred to as a 'ring-modulated laser'), a system that includes the optical source, and a technique for providing an optical signal are described. The optical source includes a semiconductor optical amplifier, with a semiconductor other than silicon, which provides a gain medium. In addition, a photonic chip, optically coupled to the semiconductor optical amplifier, includes: an optical waveguide that conveys the optical signal; and a pair of ring-resonator modulators that modulates the optical signal. Furthermore, the pair of ring-resonator modulators is included within an optical cavity in the optical source. For example, the optical cavity may be defined by a reflective coating on one edge of the semiconductor optical amplifier and a reflector on one end of the optical waveguide. Alternatively, the optical cavity may be defined by reflectors on ends of the optical waveguide.

By including the pair of ring-resonator modulators within the optical cavity, the overall transmittivity of the pair of ring-resonator modulators can be modulated. In particular, the resonances of the pair of ring-resonator modulators may be push-pull modulated so that the overall transmission peak wavelength is unchanged while the overall transmittivity is modulated, thereby modulating the output optical-source power. The wavelength of the optical source may be determined by the ring-resonator-modulator resonance so that the resonance of the pair of ring-resonator modulators does not need to be aligned with the wavelength. In this way, the optical source facilitates the use of highly efficient and compact ring-resonator modulators without the difficulties and expense associated with their tuning. Therefore, the optical source can provide a low-cost, compact, energy-efficient optical source for use in inter-chip and intra-chip connections, such as wavelength-division-multiplexing (WDM) silicon-photonic links. Furthermore, the optical source may help facilitate high-speed inter- and intra-chip silicon-photonic interconnects, as well as associated systems that can include this component (such as high-performance computing systems).

Figure 1:
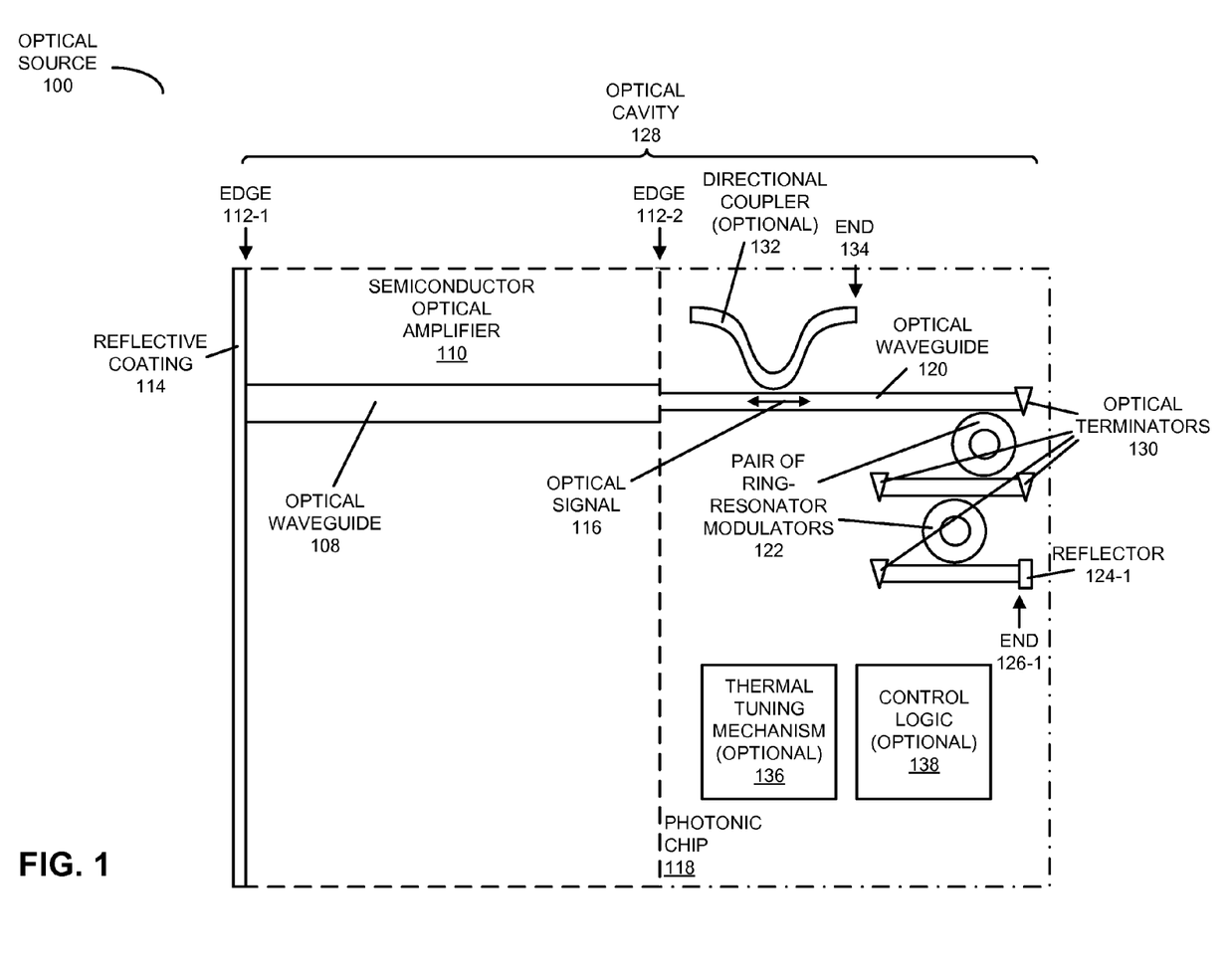
FIG. 1 is a block diagram of a top view of an optical source in accordance with an embodiment of the present disclosure.

We now describe embodiments of the optical source. FIG. 1 presents a block diagram of a top view of an optical source 100. This optical source includes a semiconductor optical amplifier 110, defined in a semiconductor other than silicon, which has edges 112. For example, the semiconductor optical amplifier 110 may be defined in a III-V semiconductor (such as gallium-arsenide or indium-phosphide), erbium or germanium, which provides a gain or active medium. Semiconductor optical amplifier 110 includes reflective coating 114 on edge 112-1 (thus, semiconductor optical amplifier 110 may be a reflective semiconductor optical amplifier), and provides an optical signal 116 at edge 112-2. In particular, optical signal 116 may have an associated carrier or fundamental wavelength $\lambda$ (such as 1.3 or 1.55 µm).

Moreover, optical source 100 includes a photonic chip 118, optically coupled to semiconductor optical amplifier 110, which includes: an optical waveguide 120 that conveys optical signal 116; a pair of ring-resonator modulators 122, optically coupled to optical waveguide 120, which modulates optical signal 116; and a reflector 124-1 optically coupled to end 126-1 of optical waveguide 120, where pair of ring-resonator modulators 122 is included within an optical cavity 128 defined by reflective coating 114 and reflector 124-1.

In an exemplary embodiment, optical waveguide 120 and pair of ring-resonator modulators 122 are defined in a semiconductor layer of photonic chip 118, such as silicon. Furthermore, the semiconductor layer may be disposed on a buried-oxide layer (such as silicon-dioxide), which, in turn, is disposed on a semiconductor substrate (such as silicon). Therefore, photonic chip 118 may be implemented using silicon-on-insulator technology.

Figure 2:
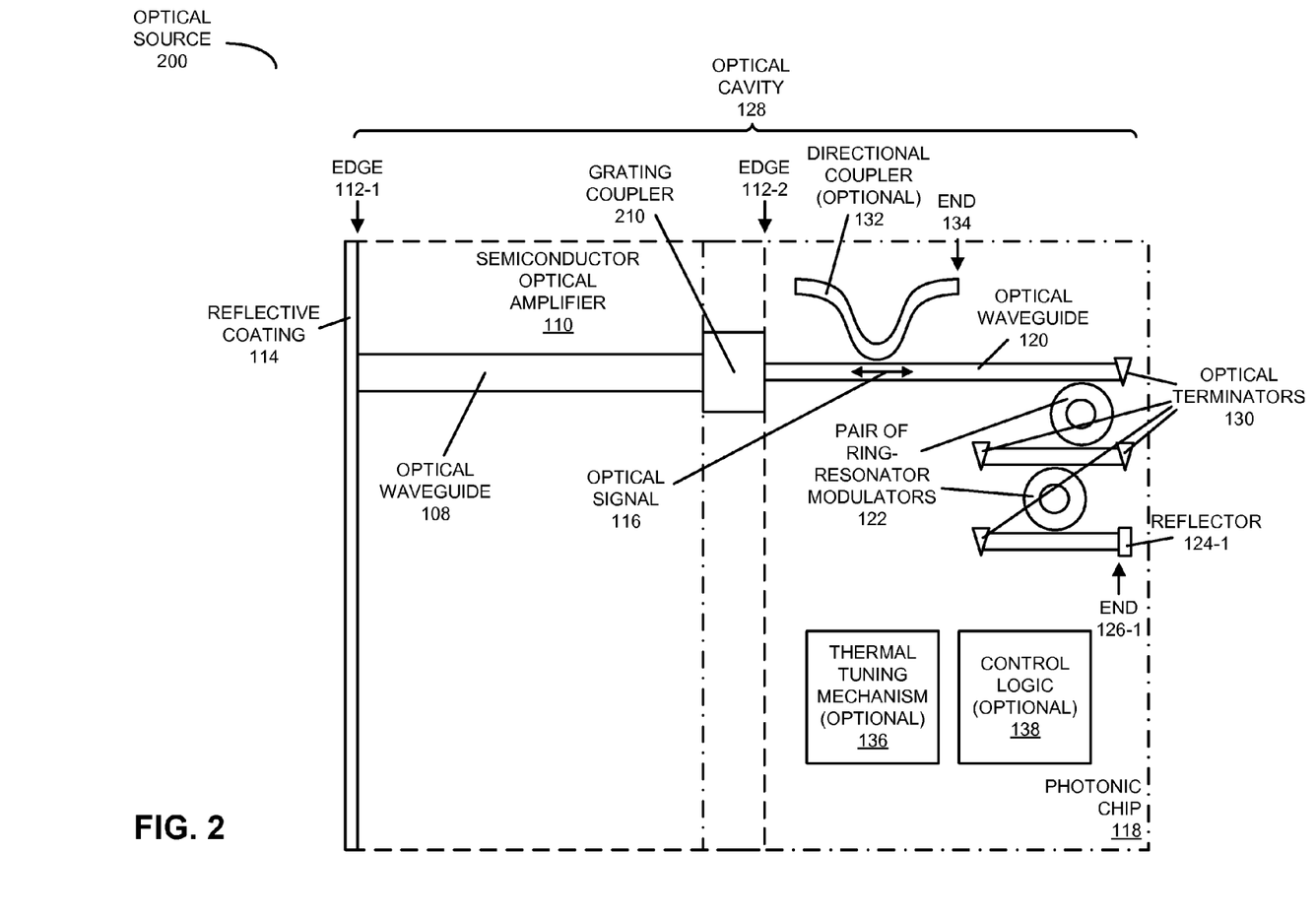
FIG. 2 is a block diagram of a top view of an optical source in accordance with an embodiment of the present disclosure.

As shown in FIG. 1, semiconductor optical amplifier 110 may be edge coupled to photonic chip 118. This edge-to-edge coupling may be facilitated by using a wide optical waveguide 108 in semiconductor optical amplifier 110 (such as an optical waveguide having a width of 2-3 µm), and optical waveguide 120 may have a width of several hundred nanometers. Alternatively, as shown in FIG. 2, which presents a block diagram of a top view of an optical source 200, semiconductor optical amplifier 110 may be surface-normal coupled to photonic chip 118. For example, semiconductor optical amplifier 110 may be flip-chip bonded onto photonic chip 118, and the surface-normal coupling may involve etched or angled mirrors or grating couplers (such as grating coupler 210).

Referring back to FIG. 1, during operation optical signal 116 couples clockwise into the top ring-resonator modulator, and then counterclockwise into the bottom ring-resonator modulator. After reflection from reflector 124-1, the propagation through pair of ring-resonator modulators 122 is reversed, and optical signal 116 propagates back into semiconductor optical amplifier 110 until it is reflected back by reflective coating 114. In conjunction with push-pull modulation provided by pair of ring-resonator modulators 122 (which is described further below with reference to FIGS. 3 and 4), this approach may progressively and/or coherently enhance the amplitude of the wavelength λ in optical signal 116. Therefore, in some embodiments optical source 100 is a laser source.

Note that optical waveguide 120 may be terminated by optical terminators 130 (which are sometimes referred to as 'absorbers' or 'deflectors'). These optical terminators may have no reflectivity, i.e., they may absorb any spurious light or optical signal that reaches them, thereby ensuring that there are no alternative optical paths in optical source 100. In some embodiments, optical terminators 130 include germanium.

Figure 3:
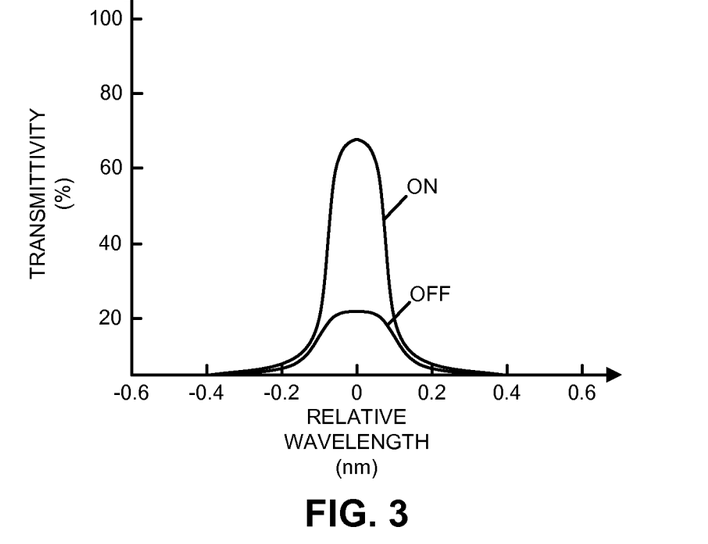
FIG. 3 is a drawing of transmission during push-pull modulation of a pair of ring-resonator modulators in accordance with an embodiment of the present disclosure.
Figure 4:
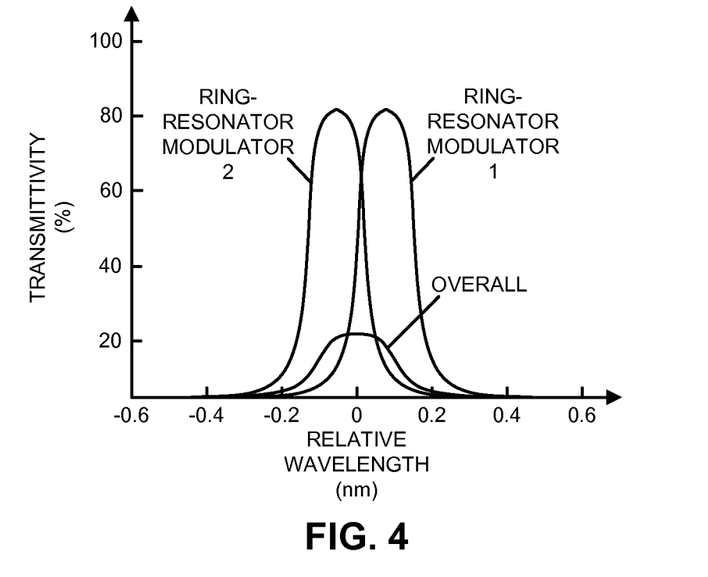
FIG. 4 is a drawing of transmission during an OFF state of push-pull modulation of a pair of ring-resonator modulators in accordance with an embodiment of the present disclosure.

Pair of ring-resonator modulators 122 may electrically modulate optical loss in optical cavity 128 (in essence, pair of ring-resonator modulators 122 function as high-speed variable attenuators). In particular, the resonances of pair of ring-resonator modulators 122 may be push-pull modulated so that in a first ('ON') state resonances of pair of ring-resonator modulators 122 are aligned (and, thus, the transmittivity and the output power is maximized) and in a second ('OFF') state the resonances are pushed apart (so the transmittivity and the output power is reduced). This is illustrated in FIG. 3 (which presents a drawing of transmission during the ON and the OFF states of push-pull modulation of pair of ring-resonator modulators 122) and FIG. 4 (which presents a drawing of transmission during the OFF state of push-pull modulation of pair of ring-resonator modulators 122). In some embodiments, the electrical modulation of pair of ring-resonator modulators 122 involves high-speed (at 30-40 Gb/s) reversed-bias modulation by applying an electrical signal up to a few volts to pair of ring-resonator modulators 122. Moreover, the contrast in the transmittivity between the ON and OFF states may be approximately 5 dB, which can cause at least an extinction ration (ER) of 5 dB in the modulated output signal 116 (depending on the current to semiconductor optical amplifier 110). Thus, push-pull modulation may change the transmittivity of pair of ring-resonator modulators 122, but may keep the wavelength λ constant. Therefore, pair of ring-resonator modulators 122 may modulate the loss in optical cavity 128 without changing the gain or the current in optical cavity 128.

Note that pair of ring-resonator modulators 122 may not need to be tuned because the modulation occurs inside of optical cavity 128. Moreover, because two high-Q devices (pair of ring-resonator modulators 122) in optical source 100 do not need to be tuned, the narrow modulation bandwidth of pair of ring-resonator modulators 122 can be used as an advantage in optical source 100, and external modulation may not be needed.

Optical signal 116 may be extracted or output from the optical source in a variety of ways. For example, an optical directional coupler 132 may be used so that optical signal 116 is output from end 134. This may allow optical signal 116 to be output into an optical waveguide. Alternatively, reflective coating 114 and/or reflector 124-1 may only partially reflect optical signal 116. In particular, a low-reflectivity (20-30%) coating may be used in reflective coating 114 and/or reflector 124-1 so that optical signal 116 is output at edge 112-1 or end 126-1. The former may allow optical signal 116 to be output from semiconductor optical amplifier 110 directly into an optical fiber.

In some embodiments, the wavelength λ from optical source 100 fluctuates depending on the temperature. However, by controlling the temperature of optical source 100, the wavelength λ can be controlled. Therefore, in some embodiments, the optical source includes an optional thermal tuning mechanism 136 that adjusts the temperature and, thus, the wavelength λ of optical signal 100. For example, an optional heater may be defined in the semiconductor layer of photonic chip 118. In addition, optional control logic 138 (which may be a circuit implemented in silicon) may adjust the optional thermal tuning mechanism 136 in a wavelength-based feedback loop. To facilitate feedback control, optical source 100 may include an optional wavelength sensor (not shown) or an interface (not shown) that receives information from an optional external wavelength sensor (not shown).

In an exemplary embodiment, each of pair of ring-resonator modulators 122 is identical to the other. In addition, the radii of pair of ring-resonator modulators 122 may be small so that the free-spectral range (FSR) is large. For example, a ring-resonator modulator with a radius less than 5 μm may be used with an FSR greater than 20 nm.

Figure 5:
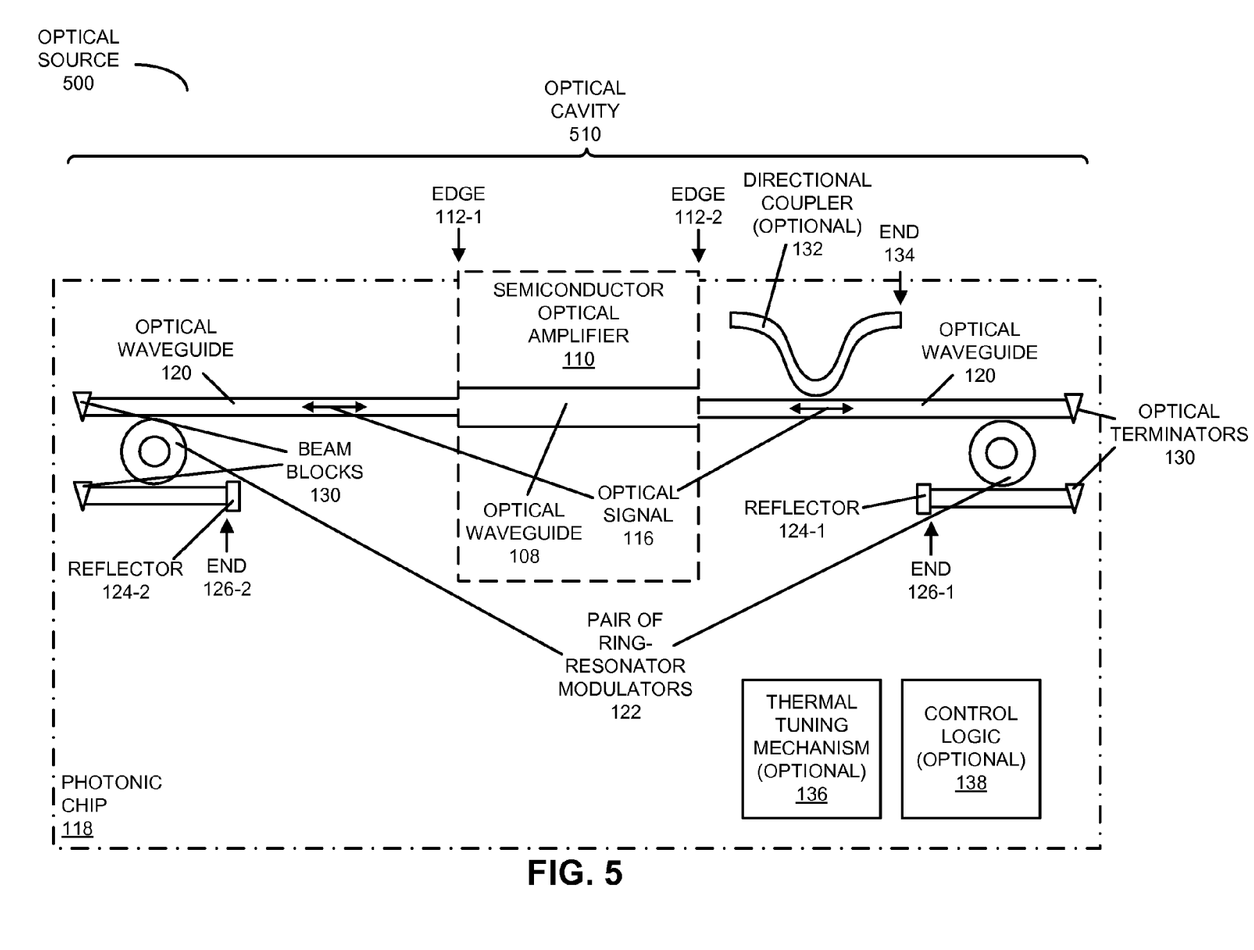
FIG. 5 is a block diagram of a top view of an optical source in accordance with an embodiment of the present disclosure.

In a variation on the optical source, semiconductor optical amplifier 110 may be evanescent coupled or surface-normal coupled to the photonic chip. For example, semiconductor optical amplifier 110 may be flip-chip or wafer-bonded onto photonic chip 118. This is shown in FIG. 5, which presents a block diagram of a top view of an optical source 500.

In optical source 500, semiconductor optical amplifier 110 does not include reflective coating 114. Instead, semiconductor optical amplifier 110 may provide optical signal 116 at edges 112. Moreover, optical waveguide 120 may convey optical signal 116 from edges 112, and pair of ring-resonator modulators 122, optically coupled to optical waveguide 120, may modulate optical signal 116. Furthermore, optical source 500 may include reflectors 124 optically coupled to ends 126 of optical waveguide 120. Additionally, pair of ring-resonator modulators 122 is included within an optical cavity 510 defined by reflectors 124. Note that optical signal 116 may be output at: reflector 124-1, reflector 124-2, and/or end 134 of optional directional coupler 132.

Figure 6:
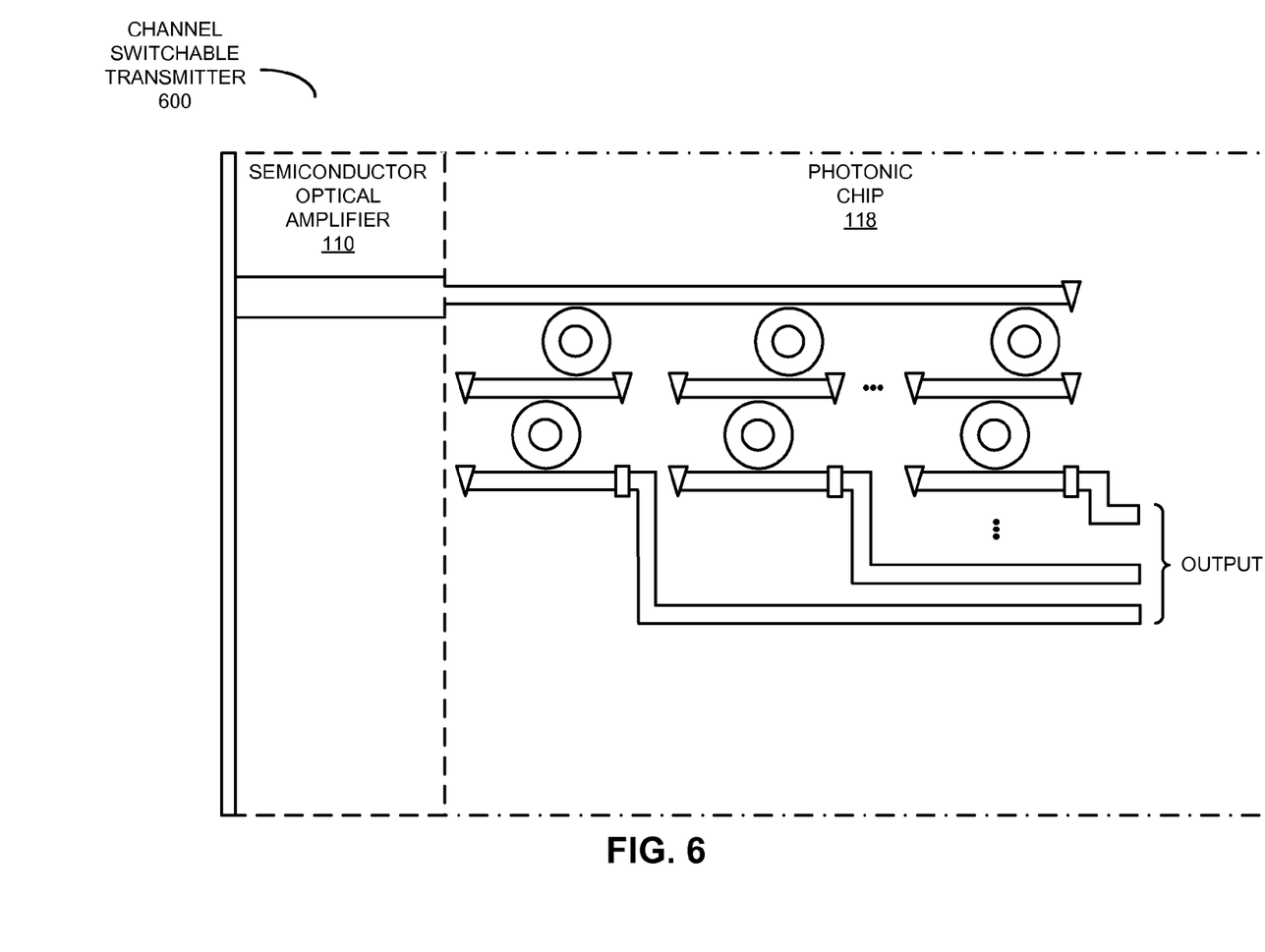
FIG. 6 is block diagram of a top view of a channel switchable transmitter in accordance with an embodiment of the present disclosure.

The optical source may be used to create a channel switchable transmitter, such as channel switchable transmitter 600 shown in FIG. 6, which uses edge-coupling between the optical waveguides in the semiconductor amplifier and the photonic chip. (However, surface-normal coupling or evanescent coupling may also be used.) In channel switchable transmitter 600, reflectors 124 are partial reflectors that provide output signals for different channels. Furthermore, the radii of the pair of ring-resonator modulators may be incrementally varied to make the wavelength λ different for different channels. Note that only one channel may be enabled at any instant time. All the other channels may be disabled by modulating the other pairs of ring-resonator modulators so that the resonances within each pair are widely separated. In this way, channel switchable transmitter 600 can selectively talk to different channels using a single optical source.

Figure 7:
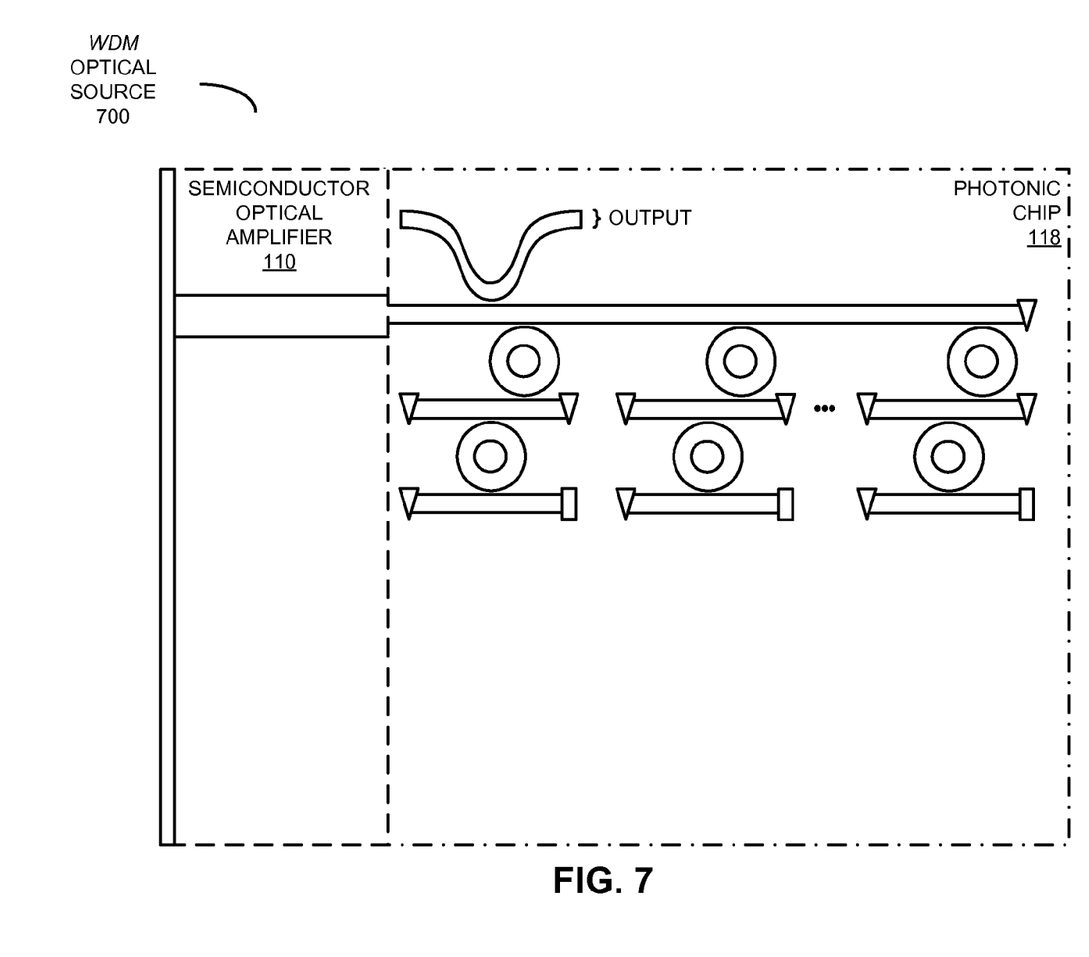
FIG. 7 is a block diagram of a top view of a wavelength-division-multiplexing (WDM) optical source in accordance with an embodiment of the present disclosure.

Using a quantum-dot gain or active material, the optical source can be used to create a modulated WDM optical source without using an external multiplexer. This is shown in FIG. 7, which presents a block diagram of a top view of a WDM optical source 700. While WDM optical source 700 is illustrated using edge-coupling between the optical waveguides in the semiconductor amplifier and the photonic chip, surface-normal coupling or evanescent coupling may also be used. In the case of evanescent coupling, instead of coupling the optical signal or light out of an edge, two optical waveguides may be brought into proximity using a gradual taper. While this is not shown in the preceding embodiments, evanescent coupling may be used to optically couple the optical signal between the semiconductor amplifier and the photonic chip.

In WDM optical source 700, reflectors 124 are total reflectors (such as a grating reflector or a loop mirror). Once again, the radii of the pair of ring-resonator modulators may be incrementally varied to make the wavelength λ different for different channels. More generally, a variety of techniques may be used to vary the resonant wavelengths of different ring-resonator modulators, including changing the effective index of refraction of ring-resonator modulators having the same radii to change the effective optical lengths (and, thus, the resonant wavelengths). The index of refraction may be changed using: an electrooptic material (such as a liquid crystal), cladding layers having a different index of refraction an optical waveguide, a different width of the optical waveguide that constitutes a ring-resonator modulator, and/or thermal tuning (i.e., changing the temperature of a ring-resonator modulator).

However, the use of a quantum-dot semiconductor optical amplifier may allow stable simultaneous output or lasing at multiple wavelengths without interference or crosstalk between different channels because of reduced gain competition and mode partition noise. Moreover, a directional coupler in the optical cavity provides the output optical signal, which includes multiple wavelengths with each channel individually modulated. In addition to avoiding the external modulator, this design avoids the use of a multiplexer, which can save: area, optical loss, and tuning power.

A key requirement for the optical source is to create an optical cavity that integrates a laser gain medium and the pair ring-resonator modulators. In general, a wide variety of platforms and integration strategies can be used. In addition to the hybrid optical sources described previously (with a separate semiconductor optical amplifier, which includes a semiconductor other than silicon, and a photonic chip), in other embodiments the entire optical source may be fabricated using a III-V semiconductor material, including the gain, the optical waveguide, and the pair of ring-resonator modulators. Alternatively, a germanium-based gain medium may be included in a silicon-on-insulator platform so that the entire optical source can be fabricated using group IV semiconductors (other than silicon).

Figure 8:
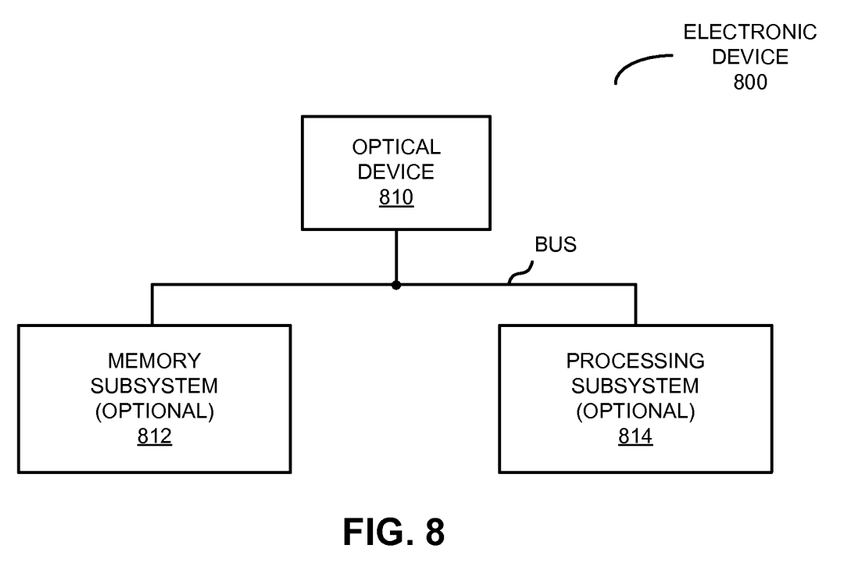
FIG. 8 is a block diagram illustrating a system that includes an optical source in accordance with an embodiment of the present disclosure.

One or more of the preceding embodiments of the optical source may be included in a system and/or an electronic device. FIG. 8 presents a block diagram illustrating a system 800 that includes an optical source 810.

In general, functions of optical source 100 (FIG. 1), optical source 200 (FIG. 2), optical source 500 (FIG. 5), channel switchable transmitter 600 (FIG. 6), WDM optical source 700 (FIG. 7), and system 800 may be implemented in hardware and/or in software. Thus, system 800 may include one or more program modules or sets of instructions stored in an optional memory subsystem 812 (such as DRAM or another type of volatile or non-volatile computer-readable memory), which may be executed by an optional processing subsystem 814. Note that the one or more computer programs may constitute a computer-program mechanism. Furthermore, instructions in the various modules in optional memory subsystem 812 may be implemented in: a high-level procedural language, an object-oriented programming language, and/or in an assembly or machine language. Note that the programming language may be compiled or interpreted, e.g., configurable or configured, to be executed by the processing subsystem.

Components in system 800 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 800 may be at one location or may be distributed over multiple, geographically dispersed locations.

System 800 may include one of a variety of devices, including: a VLSI circuit, a switch, a hub, a bridge, a router, a communication device or system (such as a WDM communication system), a storage area network, a data center, a network (such as a local area network), a computer system (such as a multiple-core processor computer system), a desktop or personal computer, a server (such as a multi-socket, multi-rack server), a work station, a mainframe computer, a blade, an enterprise computer, a supercomputer, a network-attached-storage (NAS) system, a storage-area-network (SAN) system, a laptop computer, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

The preceding embodiments may include fewer components or additional components. For example, the semiconductor layer may include poly-silicon or amorphous silicon and/or the semiconductor substrate may be one of multiple substrates in a multi-chip module (such as a multi-chip module in which alternating facing chips that include routing and bridge layers are coupled using optical proximity communication). Furthermore, a wide variety of fabrication techniques may be used to fabricate the optical source in the preceding embodiments of the optical source, as is known to one of skill in the art. For example, instead of flip-chip or wafer bonding, the semiconductor optical amplifier may be monolithically integrated onto a silicon-on-insulator substrate by epitaxial growth or using another fabrication technique. In addition, a wide variety of optical components may be used in or in conjunction with the optical source.

Although these embodiments are illustrated as having a number of discrete items, the embodiments of the optical source and the system are intended to be functional descriptions of the various features that may be present rather than structural schematics of the embodiments described herein. Consequently, in these embodiments two or more components may be combined into a single component, and/or a position of one or more components may be changed.

While the preceding embodiments illustrate the use of the optical source in conjunction with an optical link, the optical source may be used in applications other than communications, such as: manufacturing (cutting or welding), a lithographic process, data storage (such as an optical-storage device or system), medicine (such as a diagnostic technique or surgery), a barcode scanner, entertainment (a laser light show), and/or metrology (such as precision measurements of distance).

In the preceding description, we refer to 'some embodiments.' Note that 'some embodiments' describes a subset of all of the possible embodiments, but does not always specify the same subset of embodiments.

Figure 9:
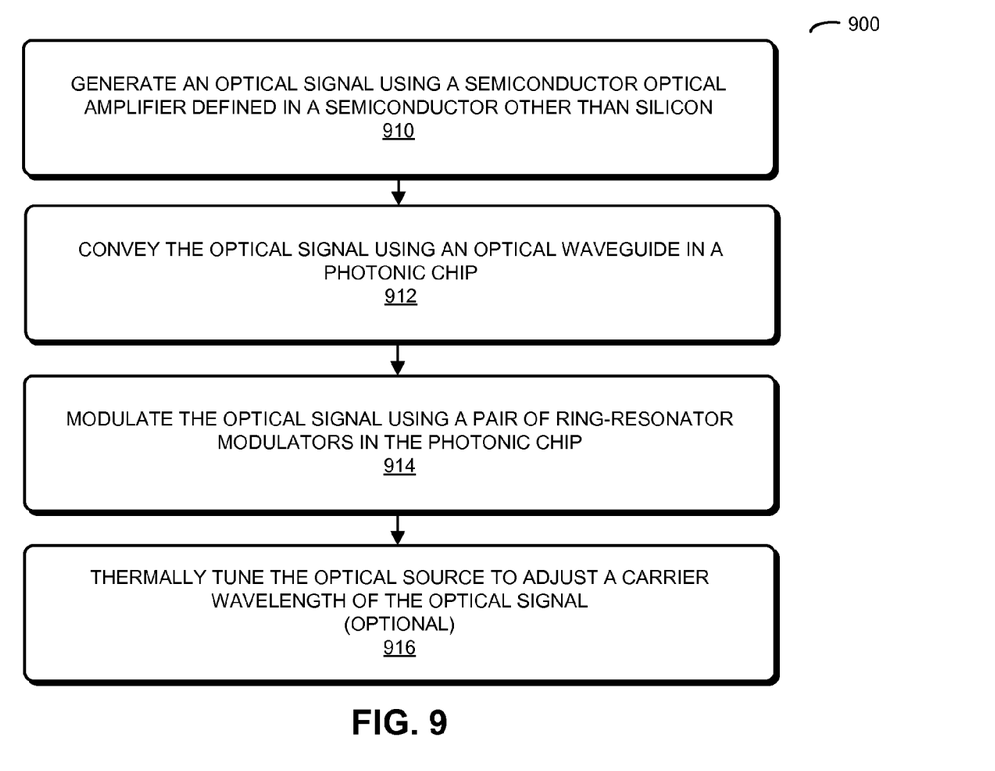
FIG. 9 is a flow chart illustrating a method for providing an optical signal in accordance with an embodiment of the present disclosure.

We now describe embodiments of the method. FIG. 9 presents a flow chart illustrating a method 900 for providing an optical signal having a wavelength, which may be performed using one of the embodiments of the optical source. During operation of the optical source, a semiconductor optical amplifier, defined in a semiconductor other than silicon, generates the optical signal (operation 910). Then, an optical waveguide on a photonic chip conveys the optical signal (operation 912). Moreover, a pair of ring-resonator modulators on the photonic chip modulates the optical signal (operation 914), where the optical signal is shared between the pair of ring-resonator modulators using the optical waveguide, and where the pair of ring-resonator modulators is included within an optical cavity of the optical source.

In some embodiments, a thermal tuning mechanism optionally thermally tunes the optical source to adjust a carrier wavelength of the optical signal (operation 916).

Note that, because the lasing or output wavelength(s) is defined by the ring-resonator modulators, the ring-modulated laser can 'correct and fix' the ring-resonator modulators by adding or subtracting an optical material to the optical waveguide or cladding after fabrication to correct for manufacturing errors (which can be used to change the effective index of refraction of the optical waveguide in a ring-resonator modulator). As a consequence, it may not be necessary to use the ring-resonator modulators to dynamically tuned to the laser or the optical source. Moreover, if the temperature difference that the ring-resonator modulators are exposed to is sufficient to avoid wavelength collision (i.e., is sufficient to keep wavelengths from wandering into each other), then a 'set and forget' technique may be used in the transmitter design, which would be very simple and, thus, would reduce cost. However, in these approaches, the resonant wavelengths of the ring-resonator modulators may need to be measured so that the magnitude of the changes in the resonant wavelengths associated with such post-fabrication one-time 'tuning' can be stored for each of the ring-resonator modulators. For example, during post-processing the optical waveguide in a ring-resonator modulator may be oxidized to permanently fix the resonant wavelength.

In some embodiments of method 900, there may be additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical source, comprising:
a semiconductor optical amplifier, defined in a semiconductor, having a first edge and a second edge, wherein the semiconductor includes one of: a III-V semiconductor, erbium and germanium, wherein the semiconductor optical amplifier includes a reflective coating on the first edge, and wherein the semiconductor optical amplifier is configured to provide an optical signal at the second edge; and
a photonic chip optically coupled to the semiconductor optical amplifier, wherein the photonic chip includes:
an optical waveguide configured to convey the optical signal;
a pair of ring-resonator modulators, optically coupled to the optical waveguide, configured to modulate the optical signal, wherein the optical signal is shared between the pair of ring-resonator modulators using the optical waveguide, wherein a wavelength of the optical signal may be determined by a resonance of the pair of ring-resonator-modulators so that the resonance of the pair of ring-resonator modulators does not need to be aligned with the wavelength of the optical signal, and wherein the pair of ring-resonator modulators are not phase modulated; and
a reflector optically coupled to an end of the optical waveguide, wherein the pair of ring-resonator modulators is included within an optical cavity defined by the reflective coating and the reflector, and wherein the pair of ring-resonator modulators modulate reflectivity of the reflector and a resulting output power of the optical signal.

2. The optical source of claim 1, wherein the semiconductor optical amplifier is edge coupled to the photonic chip.

3. The optical source of claim 1, wherein the semiconductor optical amplifier is surface-normal coupled to the photonic chip.

4. The optical source of claim 1, wherein the pair of ring-resonator modulators is configured to electrically modulate optical loss in the optical cavity.

5. The optical source of claim 1, wherein the optical source further includes a thermal tuning mechanism configured to adjust a carrier wavelength of the optical signal.

6. The optical source of claim 1, wherein the photonic chip includes:
a substrate;
a buried-oxide layer disposed on the substrate; and
a semiconductor layer disposed on the buried-oxide layer, wherein the optical waveguide and the pair of ring-resonator modulators is defined in the semiconductor layer.

7. The optical source of claim 6, wherein the substrate, the buried-oxide layer and the semiconductor layer constitute a silicon-on-insulator technology.

8. The optical source of claim 1, wherein the pair of ring-resonator modulators is push-pull modulated so that in a first state resonances of the pair of ring-resonator modulators is aligned and in a second state the resonances are pushed apart.

9. The optical source of claim 1, wherein the optical signal is output from the optical source at one of: the first edge of the semiconductor optical amplifier; the reflector; and an edge of a directional coupler that is optically coupled to the optical waveguide.

10. A method for outputting an optical signal, the method comprising:
- generating an optical signal in a semiconductor optical amplifier defined in a semiconductor, wherein the semiconductor includes one of: a III-V semiconductor, erbium and germanium;
- conveying the optical signal in an optical waveguide on a photonic chip; and
- modulating the optical signal using a pair of ring-resonator modulators on the photonic chip, wherein the optical signal is shared between the pair of ring-resonator modulators using the optical waveguide, wherein a wavelength of the optical signal may be determined by a resonance of the pair of ring-resonator-modulators so that the resonance of the pair of ring-resonator modulators does not need to be aligned with the wavelength of the optical signal, and wherein the pair of ring-resonator modulators are not phase modulated; and
- wherein the pair of ring-resonator modulators is included within an optical cavity of the optical source, and wherein the pair of ring-resonator modulators modulate reflectivity of a reflector and a resulting output power of the optical signal.

11. The method of claim 10, wherein the pair of ring-resonator modulators are configured to electrically modulate optical loss in the optical cavity.

12. The method of claim 10, wherein the method further comprises thermally tuning the optical source to adjust a carrier wavelength of the optical signal.

* * * * *

UNITED STATES PATENT AND TRADEMARK OFFICE
CERTIFICATE OF CORRECTION

PATENT NO. : 9,735,542 B2
APPLICATION NO. : 14/062624
DATED : August 15, 2017
INVENTOR(S) : Li et al.

Page 1 of 1

It is certified that error appears in the above-identified patent and that said Letters Patent is hereby corrected as shown below:

On the Title Page

In OTHER PUBLICATIONS (on page 2, Column 1, Line 8), please delete, "phototonics", and replace with --photonics--

In OTHER PUBLICATIONS (on page 2, Column 1, Line 10), please delete, "Duantum", and replace with --Quantum--

In the Claims (Column 10, Claim 1, Line 24), please delete, "ring-resonator-modulators", and replace with --ring-resonator modulators--

(Column 11, Claim 10, Line 14), please delete, "ring-resonator-modulators", and replace with --ring-resonator modulators--

Signed and Sealed this
Fourth Day of December, 2018

Andrei Iancu
*Director of the United States Patent and Trademark Office*